United States Patent [19]

Chayka et al.

[11] 4,068,170
[45] Jan. 10, 1978

[54] METHOD AND APPARATUS FOR CONTACTING THE LEAD OF AN ARTICLE

[75] Inventors: George A. Chayka, Northampton County; Joel J. Koehler, Lehigh County; Livio R. Melatti, Northampton County, all of Pa.

[73] Assignee: Western Electric Company, Inc., New York, N.Y.

[21] Appl. No.: 640,594

[22] Filed: Dec. 15, 1975

[51] Int. Cl.$^2$ .......................................... G01R 31/02
[52] U.S. Cl. ............................... 324/72.5; 339/74 R; 324/158 P
[58] Field of Search ............... 324/72.5, 158 F, 158 P; 339/258 R, 75 MP, 74 R, 91 R

[56] References Cited

U.S. PATENT DOCUMENTS

| | | | |
|---|---|---|---|
| 2,711,523 | 6/1955 | Willis | 324/72.5 X |
| 3,573,617 | 4/1971 | Randolf | 324/158 |
| 3,710,303 | 1/1973 | Gallager, Jr. | 339/74 R X |
| 3,848,221 | 11/1974 | Lee, Jr. | 339/74 R |
| 3,945,710 | 3/1976 | Gartland, Jr. | 339/258 R |

FOREIGN PATENT DOCUMENTS 1,374,648  8/1964  France .......................... 339/258 R

OTHER PUBLICATIONS

Split-Tip Probe for Terminal Resistance Measurements, R. M. Murcko IBM Tech Disc. Bulletin, vol. 14, No. 2, July, 1971, p. 479.

Primary Examiner—Rudolph V. Rolinec
Assistant Examiner—Vincent J. Sunderdick
Attorney, Agent, or Firm—R. Y. Peters

[57] ABSTRACT

Leads of electronic components, such as dual-inline packages, are contacted for test purposes by opposed pairs of cantilever-spring contacts. The tips of each pair of contacts are offset with respect to each other when in position for testing so that they do not touch each other when a lead is absent. The opposed contacts provide equal forces on opposite sides of the leads, so that no lead support is required for testing, and also provide open circuits instead of shorted circuits when a lead is absent.

10 Claims, 6 Drawing Figures

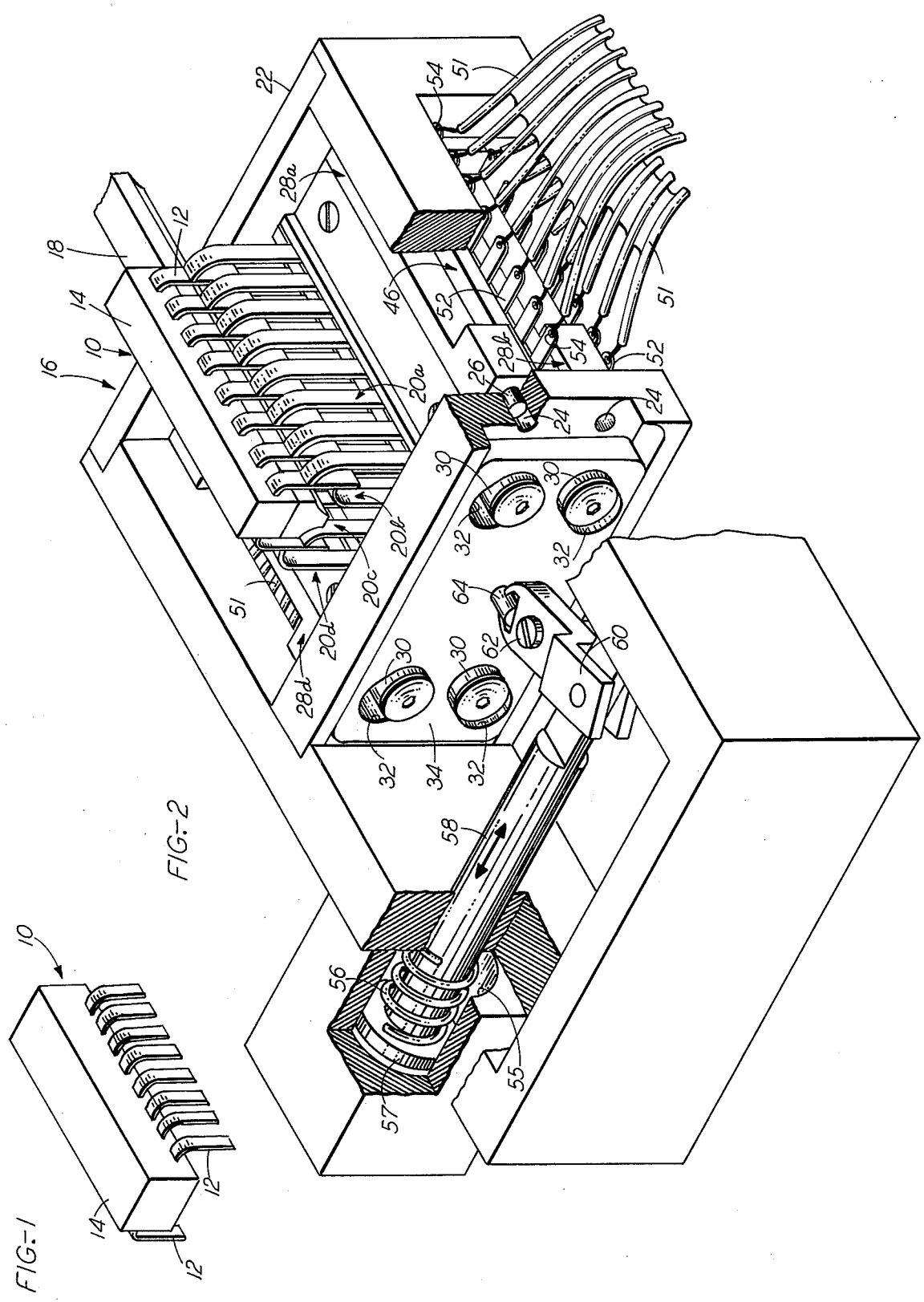

METHOD AND APPARATUS FOR CONTACTING THE LEAD OF AN ARTICLE

BACKGROUND OF THE INVENTION

1. Field of the Invention

The invention relates to methods and apparatus for contacting the lead of an article and, more particularly, to methods and apparatus for contacting the leads of an electronic component for electrically testing the component.

2. Description of the Prior Art

In the manufacture of semiconductor devices, semiconductor chips containing the active elements are bonded to a substrate containing a conductor pattern which extends to a pair of opposite edges of the substrate. Leads are bonded to the conductors at these edges and the assembly is encapsulated in plastic. This provides a packaged semiconductor device having two rows of leads. Hence, such a device is commonly referred to in the industry as a dual-inline package.

The leads of the package must be contacted for test purposes. However, like many electronic devices, the leads are quite flexible and unable to resist without support the force required for good electrical contact.

In some cases the support is obtained by inserting the package in a carrier which provides a support surface on one side of a lead while a pair of contacts presses against the other. Operating the contacts in pairs permits one to carry a large current while the other carries a small current. However, having to insert and remove the package from a carrier or other form of support to achieve the desired electrical contact is inconvenient and costly.

In other cases, the contacts are opposed and contact opposite sides of the leads with equal force. These contacts are spread apart against spring tension to permit insertion of the leads and released to make contact. These contacts touch when no lead is in position between them and short the electrical test circuits. There is a direct connection from one contact to the other just as there is when a lead is in position. This precludes the possibility of detecting a missing lead.

SUMMARY OF THE INVENTION

Accordingly, it is an object of the invention to provide new and improved methods and apparatus for contacting the lead of an article. It is another object of the invention to provide new and improved methods and apparatus for contacting leads such that the contacts do not touch when a lead is absent.

These and other objectives are accomplished by supporting contacts in opposed pairs for movement to contact opposite sides of each lead. The contact tips are offset so that the contacts of each pair do not touch when the lead is absent.

BRIEF DESCRIPTION OF THE DRAWINGS

Other objects and features of the invention will be more readily understood from the following detailed description of specific embodiments thereof when read in conjunction with the accompanying drawings in which:

FIG. 1 is an isometric drawing of a semiconductor device having two rows of leads, i.e., a dual-inline package;

FIG. 2 is an isometric view of the contactor of the invention with the dual-inline package in position for test;

DETAILED DESCRIPTION

Figure 3:
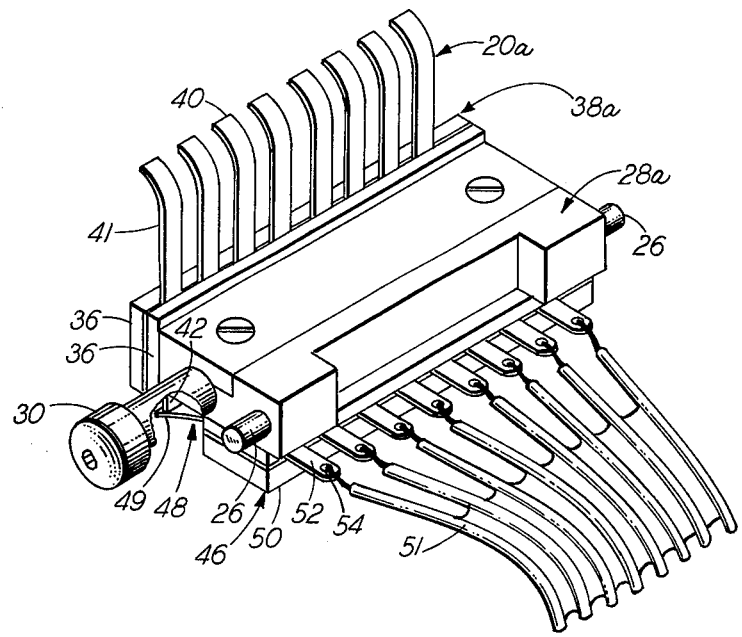
FIG. 3 is an isometric view of one arm of a pair of contactor arms.

Referring now to FIG. 1, there is shown a semiconductor device or dual-inline package 10 having leads 12 arranged in two rows of eight leads each. The leads 12 protrude from the sides of a plastic encapsulation 14 and form the external connection to an internal circuit, e.g., the thin-film conductor pattern on a ceramic to which the semiconductor chip is bonded. The number of leads 12 is not limited to eight on a side or to sixteen total. The number of leads may be any number, odd or even, to suit the device design.

In order to test the package 10, an electrical connection must be made between the leads 12 and the test apparatus. The connection may be made with the contactor 16, refer to FIG. 2, of the instant invention. The packages 10 are fed along a track or rail 18 of the test apparatus until they are in a position where their leads 12 depend between pairs of contacts 20a–20b and 20c–20d.

The contacts 20a through 20d are mounted on contact arms 28a, b, c and d, respectively, in a body or housing 22 by providing pivot support 24 and pivots 26 about which the contact arms 28 a–d may rotate. The arm 28c is not visible in FIG. 2 but is directly below arm 28d and may be seen by referring to FIG. 5.

A cam roller 30 is fixed on each arm 28 at a distance from the centerline of the pivots 26. The cam follower, i.e., roller 30, engages converging apertures or cam slots 32 in a cam plate 34. Horizontal movement of the cam plate 34 to the left in FIG. 2 causes arms 28a and d to describe downward arcs and arms 28b and c to describe upward arcs about the supports 24 to force contacts 20a–d against the leads 12. Movement of the plate 34 to the right moves the contacts 20a–d in an arcuate path away from the leads 12.

Figure 4:
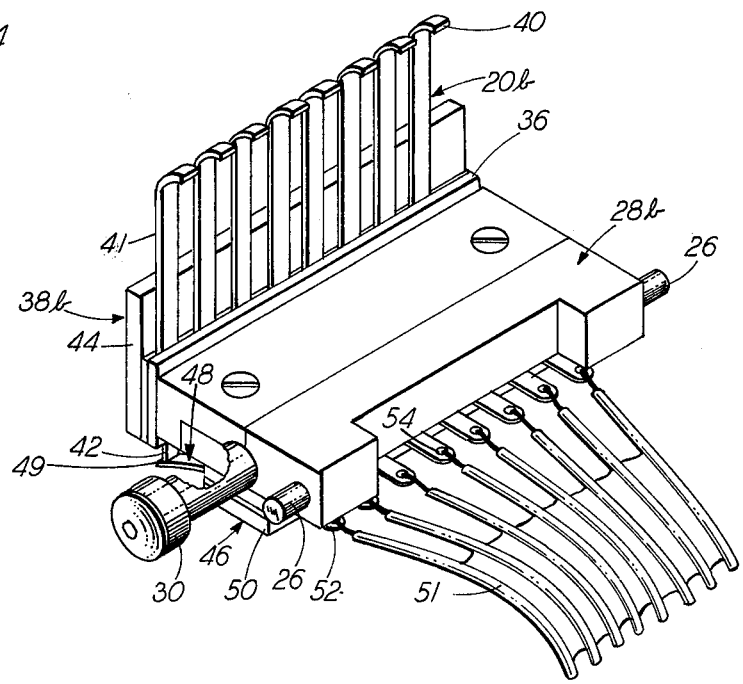
FIG. 4 is an isometric view of the other arm of the pair of contactor arms.

Referring now to FIG. 3 there is shown the arm 28a which is the same as the arm 28d. The contacts 20a, or 20d if the arm is 28d, comprising thin strips of metal, e.g., beryllium copper, gold plated, are fastened between a pair of insulating strips 36 to form a comb designated generally by the numeral 38a. Each contact 20a has a tip 40 at the end of a cantilever resilient portion 41 protruding from one side of the comb 38a and a stub 42 protruding from the other side of the comb. The comb 38a, which is made as a unit is replaceably mounted on an end of the arm 28a away from the pivot 26, and is replaceable as a unit. Likewise, referring to FIG. 4, there is shown the arm 28b which is the same as the arm 28c. The contacts 20b, or 20c if the arm is 28c, are fastened between one of the insulating strips 36 and a brace 44. The brace 44 extends upward so that the portions 41 of the contacts 20b or c above the brace 44 are the same length as the portions 41 of the contacts 20a or d above the strips 36. Thus, the contacts have equal resilience and exert equal but opposite forces on the leads 12 when in operation.

A connector card 46 is fixed to each arm 28a–d and includes resilient connectors 48, one for each contact 20, fixed between insulating strips 50. The card 46 and comb 38 are aligned and mounted so that a cantilever portion 49 of each connector 48 engages a corresponding one of each of the stubs 42. The stubs 42 deflect the connectors 48 sufficiently to generate enough contact force to provide a good electrical connection therebetween. Thus, a comb 38 having worn contacts may easily be replaced without unsoldering and soldering connections. Also, when the product to be tested changes, e.g., to a package 10 having a different number of leads 12, the contact combs 38a–d may easily be changed to accommodate the package. However, neither the combs 38 nor the cards 46 need be changed if fewer leads are to be contacted because the contacts do not touch and the circuits remain open where no lead is present.

A ribbon type conductor 51, having plural wires insulated from each other is provided for each arm 28a–d, each of the wires of the conductor 51 being soldered to a different tab 52 of the connector 48. An aperture 54 is included in each tab 52 through which the wire is threaded for making a strong connection.

Referring to FIG. 2 again, the cam plate 34 is moved to the right by a compression spring 56 which presses on the back of a piston 57 in a cylinder 55 and, through a connecting rod 58, swivels a lever 60 clockwise about a shoulder screw 62 fixed in the housing 22. The lever 60 has a forked end which engages a pin 64 in the plate 34 so that the plate slides to the right when the lever swivels clockwise. The cam plate 34 is moved to the left by the application of air pressure to the cylinder 55 to advance the piston 57 to the right against the spring 56 so that the lever 60 swivels counterclockwise.

In operation, the air pressure is released from the cylinder 55 so that the spring 56 moves the cam plate 34 to the right. This rotates the arms 28a and 28d upward and the arms 28b and c downward about the supports 24 so that contacts 20a and 20d move away from contacts 20b and 20c. A dual-inline package to be tested is then fed along the rail 18 into position for test. Air is then admitted to the cylinder 55 so that the plate 34 moves to the left thereby rotating the arms 28 in the opposite direction so that the contacts 20 are forced downward against the leads 12.

Figure 5:
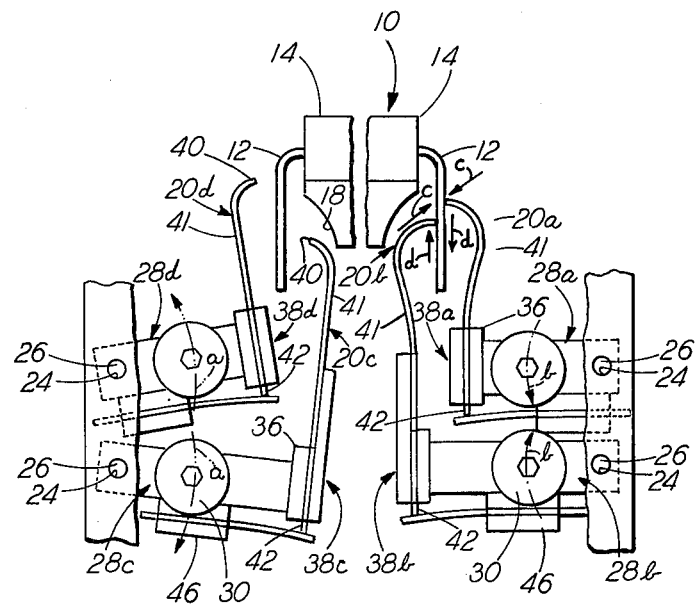
FIG. 5 is a schematic end view showing the operation of the contactor arms in contacting a lead.

Referring now to FIG. 5, the figure is a schematic end view showing the operation of the arms 28a–d in contacting leads 12 of a dual-inline package 10. The diagram has been divided, for illustrative purposes, into a right half showing the arms 28a and b in closed position for contacting the leads of the package 10 and a left half showing the arms 28c and d in open position for receiving a package to be tested. Starting with the left hand side of FIG. 5, the arms 28c and d are opened, into the position shown, by the cam slots 32 in cam plate 34 (neither shown) acting on the rollers 30 to rotate the arms about the pivot supports 24 in the direction of the arrows a—a.

When a package 10 has been fed into position on the rail 18, the arms 28a and b are closed by the cam slots 32 in cam plates 34 acting on the cam rollers 30 to rotate the arms about the pivot supports 24 in the direction of the arrows b—b. The tips 40 of the contacts 20a and b travel in arcuate paths, indicated by the arrows c—c, about the supports 24 until they are stopped by contact with the lead 12. Rotation of the arms 28a and b continues a little further but since the tips 40 cannot move further along the arcuate paths, the tips 40 of contacts 20a are forced to move downward and the tips 40 of contacts 20b are forced to move upward as indicated by the arrows d—d. This wiping movement produces a clean area under each tip 40 which is essential for a good electrical connection.

Figure 6:
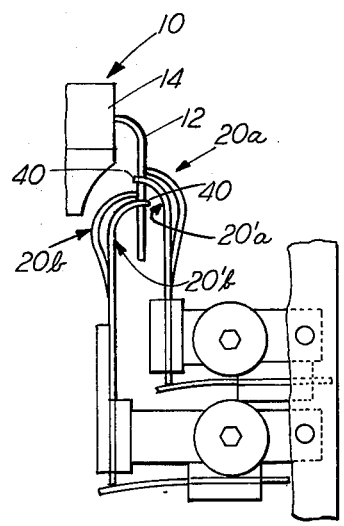
FIG. 6 is the right half of FIG. 5 showing the contact arms in closed position with one lead absent.

Referring to FIG. 6, there is shown the right half of FIG. 5 but with the first lead 12 of the package 10 removed. The contacts 20'a and 20'b would have contacted the first lead 12 if it has been present. However, it is absent. In prior art contactors with opposed contacts, the tips 40 would touch and the test circuits connected thereto would short together. In the instant contactor, however, even though the contacts 20'a and 20'b overlap, the tips 40 do not touch because they are offset vertically with respect to each other. Consequently, the circuits connected to the contacts 20'a and 20'b, and any other pairs of contacts 20a–b and 20c–d where a lead 12 is absent, are open. Thus, it is possible to determine electrically when a lead is being contacted and when it is not by checking electrical continuity. Also, if a lead is missing, it is possible to detect this and reject the package. Therefore, it is possible to identify packages by intentionally removing a lead or leads. In turn this makes automatic sorting and identificaton possible. This is not possible where the contacts touch either the leads, or themselves when the lead is absent, because in both cases the contacts are electrically connected.

Since the unsupported lengths, i.e., cantilever portions 41, of the contacts 20a–d are the same and exert equal forces on opposite sides of each lead, no carrier or other means is required to support the leads 12 for making electrical contact. When the forces are substantially unbalanced or both contacts 20a and b, or 20c and d exert forces on the same side of a lead 12, some form of carrier or test fixture support is required.

While there has been described and illustrated herein practical embodiments of the present invention, it is to be understood that various modifications and refinements which depart from the disclosed embodiment may be adopted without departing from the spirit and scope of the invention.

What is claimed is:

1. Apparatus for contacting a lead of an article, which comprises:
    at least one pair of contact elements, each element being insulated from the other and having a contact tip;
    means for supporting the elements;
    means for connecting the elements resiliently to circuit conductors; and
    means for moving the elements to engage the tips on opposite sides of the leads with oppositely directed balanced forces, one tip being offset with respect to the other at engagement.

2. A contactor for electrically testing an article having at least one lead, which comprises:
    a support housing;
    at least one pair of replaceable contact members mounted in the housing for movement relative thereto for contacting opposite sides of the lead, each member being electrically insulated from the other and having a contact tip which is offset with respect to the other when contacting the lead; and
    means for moving the contact members in opposite directions to engage and disengage the tips with the opposite sides of the lead.

3. A contactor as recited in claim 2 which further comprises:
supports in the housing for pivots;
a resilient contact portion adjacent the tip of each contact member;
an arm to support the contact portion; and
pivots adjacent one extremity of the arm to engage the supports in the housing.

4. A contactor as recited in claim 3 which further comprises:
a cam follower mounted on each arm and spaced from the pivot;
a cam mounted for movement in the housing, the cam having a pair of oppositely-sloped cam slots which engage the cam followers; and
means for moving the cam to move the contact tips into and out of engagement with the lead.

5. A contactor as recited in claim 4 for electrically testing an article having a row of leads which comprises:
a pair of elongated contact members for each lead in the row;
a resilient contact portion adjacent one extremity of each contact member;
a stub portion at the other extremity of each contact member; and
a resilient connector, one for each contact member, which engages the stub portion to make electrical contact to the contact member.

6. A contactor as recited in claim 5, for electrical testing a dual-inline semiconductor package which includes two rows of leads, wherein the contactor further comprises:
two pairs of contact members; and
a cam having two pairs of oppositely-sloped cam slots which engage the followers to move the contact tips into and out of engagement with the leads.

7. A contactor for electrical testing of semiconductor packages having plural rows of leads which comprises:
a body;
contact arms arranged in pairs, one pair for each row of leads;
pivots adjacent a first extremity of each contact arm for engaging the body;
a cam follower fixed to each arm and spaced from the pivots;
a cam plate supported by the body and having pairs of elongated, oppositely-sloped apertures to engage the cam followers, there being one pair of apertures for each pair of arms;
a connector card adjacent a second extremity of each arm;
resilient connectors, one fixed in the card for each lead in a row;
a contact comb mounted on the second extremity of the contact arm;
resilient contacts fixed in the comb, one for each lead in a row, each contact having a tip at one end for contacting a lead and a stub at the other end for engaging a connector, each contact of a pair having about the same resilience in order to exert balanced contact forces on a lead, the comb being aligned with the card so that the stub of each contact engages a respective connector; and
means for moving the cam plate to rotate the arms of each pair in opposite directions to move the contact tips into and out of engagement with the leads.

8. A method of contacting an article for electrical test wherein the article includes at least one lead which comprises:
moving electrically insulated contacting elements, disposed on opposite sides of the lead, in opposite directions to contact the lead;
contacting opposite sides of the lead in offset relationship to provide balanced contact forces and prevent contact shorting when the lead is absent; and
engaging the contact elements resiliently to establish electrical contact for testing and permit element replacement.

9. A method as recited in claim 8, wherein the contact members are pivoted and the step of moving the contact elements further comprises:
moving the contact elements in an arcuate path to contact the lead.

10. A method as recited in claim 9, wherein the article is an electronic component and the step of moving the contact elements in an arcuate path further comprises:
continuing the arcuate movement of the elements beyond initial contact with the leads to produce a wiping contact.

* * * * *